United States Patent
Demir et al.

(10) Patent No.: US 7,133,644 B2
(45) Date of Patent: Nov. 7, 2006

(54) DIGITAL BASEBAND SYSTEM AND PROCESS FOR COMPENSATING FOR ANALOG RADIO TRANSMITTER IMPAIRMENTS

(75) Inventors: Alpaslan Demir, Commack, NY (US); Leonid Kazakevich, Plainview, NY (US); Kenneth P. Kearney, Smithtown, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 106 days.

(21) Appl. No.: 10/736,294

(22) Filed: Dec. 15, 2003

(65) Prior Publication Data

US 2004/0248516 A1    Dec. 9, 2004

Related U.S. Application Data

(60) Provisional application No. 60/476,314, filed on Jun. 6, 2003.

(51) Int. Cl.
*H04B 17/00* (2006.01)
*H04B 1/26* (2006.01)
*H04L 25/06* (2006.01)

(52) U.S. Cl. ................ 455/67.11; 455/67.13; 455/63.1; 455/324; 375/319

(58) Field of Classification Search ............ 455/63.1, 455/67.11, 67.13, 276.1, 283, 278.1, 324; 375/319; 331/66, 69, 70, 176
See application file for complete search history.

(56) References Cited

U.S. PATENT DOCUMENTS

| | | | |
|---|---|---|---|
| 6,169,463 B1* | 1/2001 | Mohindra et al. | 332/104 |
| 6,313,703 B1* | 11/2001 | Wright et al. | 330/149 |
| 6,759,902 B1* | 7/2004 | Kossor | 330/136 |
| 6,836,493 B1* | 12/2004 | Mahowald et al. | 372/38.01 |
| 2004/0219884 A1* | 11/2004 | Mo et al. | 455/67.11 |

* cited by examiner

*Primary Examiner*—Matthew Anderson
*Assistant Examiner*—Eugene Yun
(74) *Attorney, Agent, or Firm*—Volpe and Koenig, P.C.

(57) ABSTRACT

In order to compensate for performance degradation caused by inferior low-cost analog radio component tolerances of an analog radio, a wireless communication transmitter employs a control process to implement numerous digital signal processing (DSP) techniques to compensate for deficiencies of such analog components so that modern specifications may be relaxed. By monitoring a plurality of parameters associated with the analog radio, such as temperature, bias current or the like, enhanced phase and amplitude compensation, as well as many other radio frequency (RF) parameters may be implemented.

34 Claims, 6 Drawing Sheets

DIGITAL BASEBAND SYSTEM AND PROCESS FOR COMPENSATING FOR ANALOG RADIO TRANSMITTER IMPAIRMENTS

CROSS REFERENCE TO RELATED APPLICATION(S)

This application claims priority from U.S. provisional application No. 60/476,314, filed Jun. 6, 2003, which is incorporated by reference as if fully set forth.

FIELD OF THE INVENTION

The present invention generally relates to transmitter design in wireless communication systems. More particularly, the present invention relates to digital signal processing (DSP) techniques used to compensate for the impairments introduced in an analog radio transmitter, such as passband distortion, carrier leakage, amplitude imbalance, phase imbalance or the like.

BACKGROUND

Existing wireless system architectural configurations impose stringent constraints on the system designer with regards to transmitting communication signals. Moreover, such configurations often provide low reliability communication links, high operating costs, and an undesirably low level of integration with other system components.

In the radio frequency (RF) section of a conventional low-cost wireless transmitter configured with analog components, a considerable level of distortion occurs when RF signals are processed. Such distortions include carrier leakage, phase imbalance, amplitude imbalance, or the like. Higher cost components with better distortion characteristics that enhance signal quality may be overlooked during the design phase in order to reduce the cost of the end-product.

Because the costs of components that process RF analog signals are higher than the components that use DSP, it is desired to provide a digital baseband (DBB) system, including a low cost transmitter with low noise and minimal power requirements, that utilizes DSP techniques as much as is practicable.

SUMMARY

In order to compensate for performance degradation caused by inferior low-cost analog radio component tolerances of an analog radio, a wireless communication transmitter employs a control process to implement numerous DSP techniques to compensate for deficiencies of such analog components so that modern specifications may be relaxed. By monitoring temperature, bias current or the like, enhanced phase and amplitude compensation, as well as many other RF parameters may be implemented.

In a preferred embodiment, the present invention is a digital baseband (DBB) transmitter or a wireless transmit/receive unit (WTRU) which includes an analog radio transmitter, a digital pre-distortion compensation module, a digital direct current (DC) offset compensation module, a digital amplitude imbalance compensation module, a digital phase imbalance compensation module, at least one digital to analog converter (DAC) for interfacing the digital compensation modules with the analog radio transmitter, and at least one controller in communication with the analog radio transmitter and each of the digital compensation modules, wherein the digital compensation modules correct RF parameter deficiencies that occur in the analog radio transmitter.

The DBB transmitter may further include a modem for generating in-phase (I) and quadrature (Q) signal components which are input to each of the digital compensation modules, the DAC and the analog radio transmitter.

The DBB transmitter may further include a low pass filter (LPF) coupled to each of the I and Q inputs of the digital pre-distortion compensation module. Each LPF may be a root-raised cosine (RRC) filter.

The analog radio transmitter may include a power amplifier, a modulator, a power detector, a temperature sensor for monitoring a temperature reading associated with the analog radio transmitter, and a bias current sensor for monitoring a bias current reading associated with the analog radio transmitter. At least one of the digital compensation modules may be activated in response to the bias current sensor or the temperature sensor.

The DBB transmitter may further include a memory for storing a plurality of look up tables (LUTs). One of the LUTs may be selected for use by the digital pre-distortion compensation module in response to the temperature reading monitored by the temperature sensor.

The power amplifier may be prone to a linearity deficiency. The digital pre-distortion compensation module may be configured to distort the phase and amplitude of the I and Q signal components based on the input power level of the power amplifier as measured by the power detector, and gain and phase characteristics of the power amplifier stored in the selected LUT, such that the power amplifier generates a linear response rather than a distorted response.

The modulator may be prone to a carrier leakage deficiency. A minimum detected reading associated with each of the signal inputs may be determined. First and second DC offset compensation values are determined based on the minimum detected readings. The digital DC offset compensation module may be configured to eliminate carrier leakage associated with the modulator by adjusting the respective DC levels of the two signal inputs based on the first and second DC offset compensation values. The modulator may have a local oscillator (LO) frequency at which the minimum detected readings are determined.

The modulator may be prone to an amplitude balance deficiency. The digital amplitude imbalance compensation module may be configured to adjust the power level of one of the I and Q signal components, such that the power level of each of the I and Q signal components is the same.

The modulator may be prone to a phase balance deficiency. The digital phase imbalance compensation module may be configured to adjust the phase of the I and Q signal components, such that the phase of each of the I and Q signal components are orthogonal to each other.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

The present invention is a DBB transmitter which enables high performance solutions to be shifted from RF to digital baseband by using low performance radio components and compensating in the DBB for the lower radio performance. Thus, the present invention promotes lower cost, lower power consumption and lower hardware complexity. By providing cross optimization between the radio and the DBB, the performance compensation in DBB is tied to the characteristics of the radio that the DBB is integrated with.

Preferably, the DBB transmitter disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the DBB transmitter may be incorporated into an integrated circuit (IC) or be configured in a circuit comprising a multitude of interconnecting components.

The present invention is applicable to communication systems using time division duplex (TDD), frequency division duplex (FDD), code division multiple access (CDMA), CDMA 2000, time division synchronous CDMA (TD-SCDMA), orthogonal frequency division multiplexing (OFDM) or the like.

Figure 1:
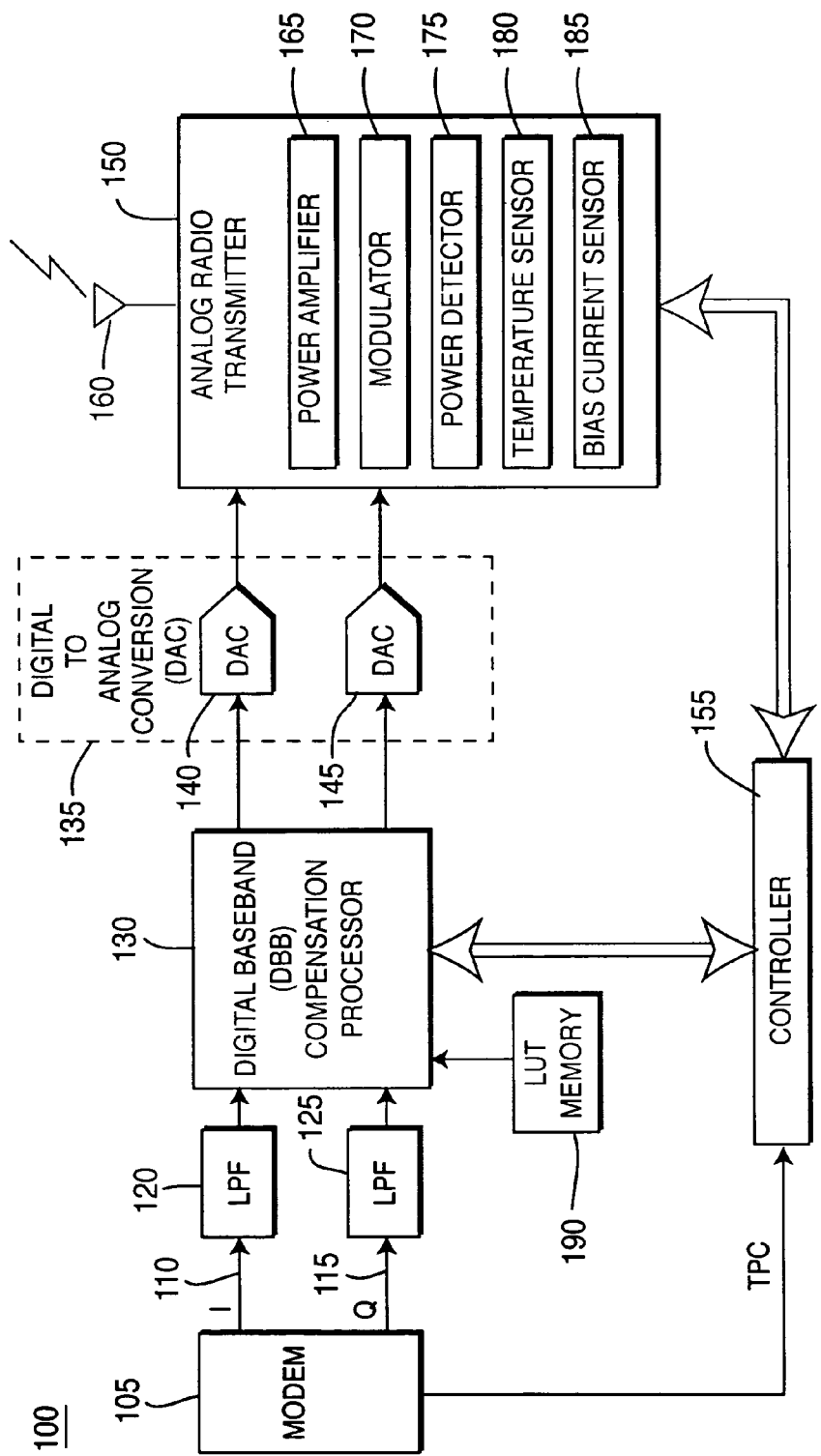
FIG. 1 is a block diagram of a transmitter with a DBB compensation processor operating in accordance with the present invention.

FIG. 1 is a block diagram of a DBB transmitter 100. The DBB transmitter 100 includes a modem 105 which outputs digital signals including in-phase (I) and quadrature (Q) signal components 110, 115, respectively and passes the digital signals through low pass filters (LPFs) 120, 125, DBB compensation processor 130 and digital to analog conversion (DAC) circuit 135, which outputs analog signals to analog radio transmitter 150. LPFs 120, 125 may be root-raised cosine (RRC) filters or other suitable filters. The DAC circuit 135 includes DACs 140 and 145.

The DBB transmitter 100 further includes a controller 155 which maintains control over the compensation processor 130 and all of the active components of the analog radio transmitter 150. Furthermore, controller 155 has access to transmit power control (TPC) signals received by the modem 105 from a base station or other entity, whereby calculations or other functions performed by the controller 155 may depend.

The analog radio transmitter 150 includes an antenna 160, a power amplifier 165, a modulator 170, a power detector 175, a temperature sensor 180 for monitoring the temperature of the analog radio transmitter 150 and a bias current sensor 185 for measuring the bias current of the analog radio transmitter 150. The components in the analog radio transmitter 150 consist of low cost (i.e., "low-end" quality) components having "relaxed" specifications. For example, the specifications for the power amplifier 165 need not be stringent because of the availability of a pre-distortion compensation module in the DBB compensation processor 130.

Figure 2:
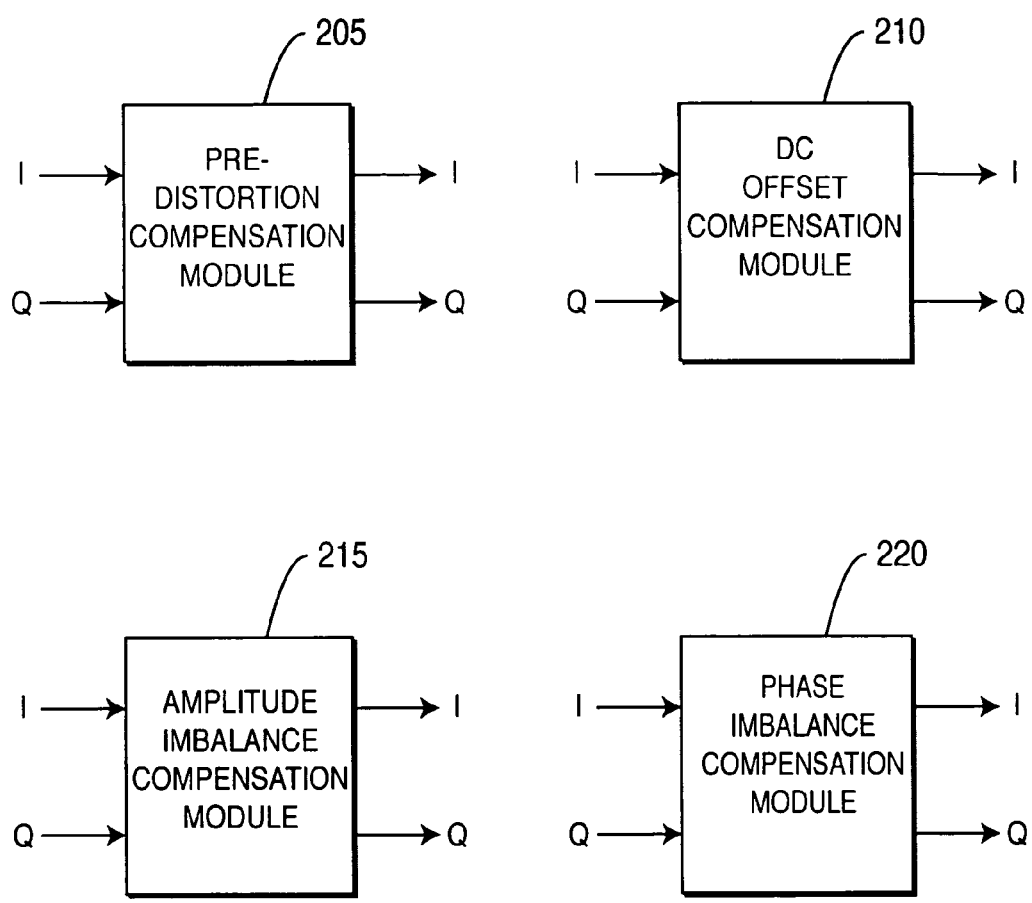
FIG. 2 shows the individual digital compensation modules that are included in the DBB compensation processor of FIG. 1.

Referring to FIG. 2, THE DBB compensation processor 130 includes one or more of the following modules used to enhance the performance of the analog radio transmitter 150:

1) a digital pre-distortion compensation module 205;
2) a digital DC offset compensation module 210;
3) a digital amplitude imbalance compensation module 215; and
4) a digital phase imbalance compensation module 220.

The digital pre-distortion compensation module 205 is used to correct transmission amplitude characteristics, such as amplitude modulation (AM) to AM and AM to phase modulation (PM) signal characteristics. The amplitude and phase characteristics of the power amplifier 165 in the analog radio transmitter 150 may be determined using a statistical sampling method or it may be based on specifications provided by the manufacturer of the power detector 165. The digital pre-distortion compensation module 205 estimates the power at the antenna 160 of the analog radio transmitter 150 based on a received signal input and a TPC command received from the modem 105. Based on known gain and phase characteristics of the power amplifier 165, the digital pre-distortion compensation module 205 purposely distorts the phase and amplitude of the I and Q signal components, such that the power amplifier 165 generates a linear response, rather than a distorted response. The digital pre-distortion compensation module 205 may refer to a look up table (LUT) or the like to obtain an inverse of such amplifier characteristics. This embodiment of the present invention is advantageous because RF parameter standards such as intermodulation distortion may be met, even though cheap and low quality components (e.g., an amplifier having a low output power rating) are used in the analog radio transmitter 150.

The digital DC offset compensation module 210 is used to correct, (i.e., suppress), carrier leakage associated with the modulator 170 in the analog radio transmitter 150 by adjusting the DC levels of the I and Q signal components based on previously determined (i.e., stored) first and second DC offset compensation values. To determine the DC offset compensation values, the I and Q signal component inputs 110, 115 of the DBB transmitter 100 are switched (switch not shown) from the modem 105 to the controller 155. The controller 155 individually sweeps the DC level of each of the I and Q signal component inputs 110, 115 (e.g., from minus to plus sequentially or vice versa) while the power detector 175 is used to determine respective first and second minimum detected readings at the local oscillator (LO) frequency of the modulator 170. The signal component input that is not currently being swept is temporarily disabled (e.g., the controller 155 turns the unswept signal component input off by setting it to zero).

The first and second DC offset compensation values (i.e., compensation factors $K_1$ and $K_2$) are derived by interpolating the first and second minimum detected readings. The first and second DC offset compensation values are then stored for future reference, whereby the DC levels of the I and Q signal components are adjusted based on the first and second DC offset compensation values, respectively.

In an alternate embodiment, the controller 155 may be used in conjunction with a detection algorithm and the power detector 175. The controller 155 simultaneously sweeps the DC level of each of the I and Q signal component inputs 110, 115. The algorithm determines at least one minimum detected reading by using a coordinate system application, whereby the DC levels of each of the I and Q signal components are applied to an x-axis and y-axis, respectively, while detected readings sensed by the power detector 175 are applied to a z-axis.

The digital amplitude imbalance compensation module 215 is used to balance the I and Q signal components, such that the modulator 170 in the analog radio transmitter 150 modulates the I and Q signal components with equal power levels. Assuming that the modulator 170 is cheap and of low quality, the modulator 170 is prone to an amplitude balance deficiency. For example, if the I signal component is 1.0 dB below the Q signal component, the digital amplitude imbalance compensation module 215 will cause the Q signal power level to be reduced by 1.0 dB. Thus, at the output of modulator 170, the I and Q signal components will be at the same amplitude. Using controller 155, the I and Q signal components may be turned on and off on an individual basis. For example, if controller 155 turns off the Q signal component, whereby only the I signal component is sent, the controller 155 can determine what power level the power detector 175 in analog radio transmitter 150 is reading. Assuming that the power level is a desired target level, the I signal component is then turned off and the Q signal component is turned back on. The digital amplitude imbalance compensation module 215 adjusts the power level of the Q signal component such that the power detector reads the same power level (i.e., the desired target level) for both the I and Q signal components.

The modulator 170 in the analog radio transmitter is also prone to a phase balance deficiency. The digital phase imbalance compensation module 220 is used to balance the phase of the I and Q signal components. The I and Q signal components are activated at the same time and then the power level of both of the I and Q signal components is reduced by 3.0 dB, (i.e., cut in half so that the power level measured by the power detector 175 is equal to the target power level when only one of the signal components is activated with orthogonal I and Q). This procedure is used to establish a reference power level, as measured by the power detector 175. If the difference between the reference power level and the current power level measured by the power sensor 175 is equal to the desired target power level, the I and Q signal components are orthogonal, whereby the real and imaginary parts have a phase difference of 90 degrees to each other. Based on power level readings performed by the power detector 175 of analog radio transmitter 150, a phase difference of less than 90 degrees between the I and Q signal components will cause the power detector 175 to read a power level greater than the target power level. A phase imbalance of greater than 90 degrees between the I and Q signal components will cause the power detector 175 to read a power level less than the target power level. The phase is adjusted by the digital phase imbalance compensation module 220 in response to a phase error derived from the difference between the target power level and the power level read by the power detector 175.

Figure 3:
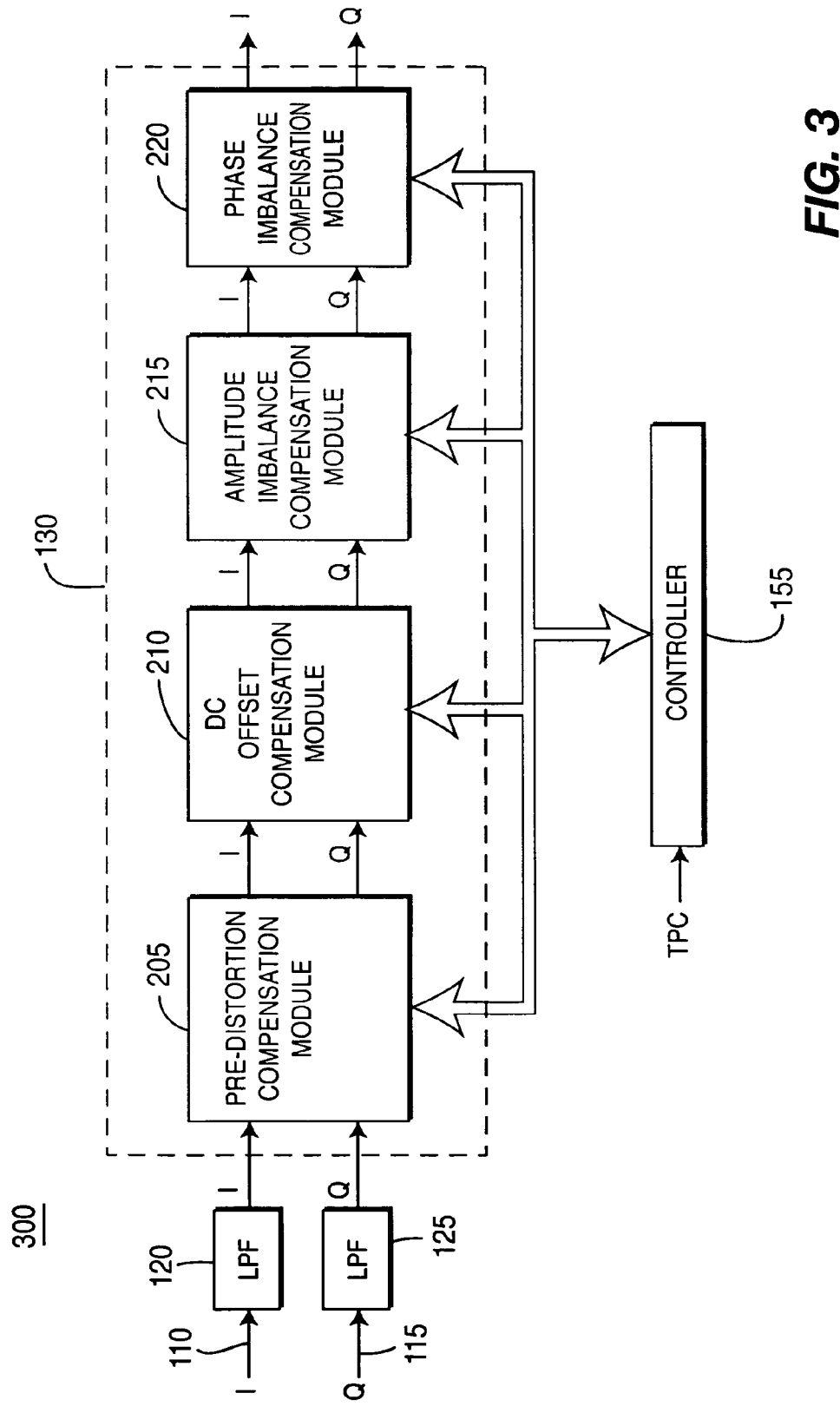
FIG. 3 shows an exemplary configuration of the digital compensation modules of FIG. 2.

The digital compensation modules included in the transmitter DBB compensation processor 130 may be designed according to numerous configurations. However, it is noted that the LPFs 120, 125, must precede the digital pre-distortion compensation module 205. FIG. 3 shows a preferred exemplary configuration 300 for the modules of the DBB compensation processor 130.

Figure 4:
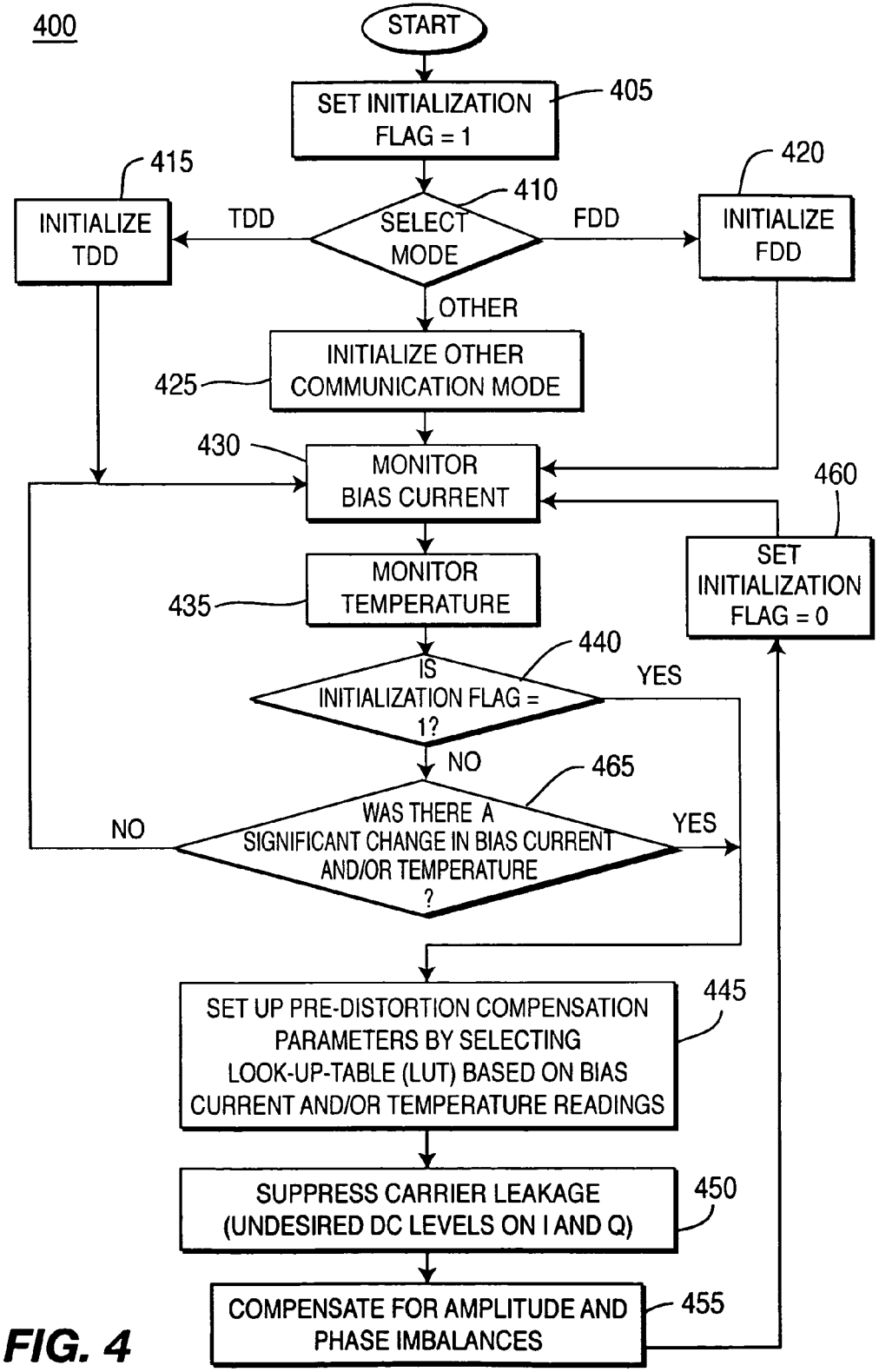
FIG. 4 is a flow chart of an exemplary control process used to compensate for impairments in the transmitter of FIG. 1.

FIG. 4 is a flow chart depicting the method steps of an exemplary process 400 used to compensate for impairments in the DBB transmitter 100. In step 405, an initialization flag is set to one, indicating that the process 400 has begun. In step 410, a desired communication mode is selected. The communication mode may be TDD, FDD or any other communication mode, such as TDSCDMA, OFDM, CDMA 200 or the like.

In step 415, if the TDD mode is selected, the TDD mode is initialized. In step 420, if the FDD mode is selected, the FDD mode is initialized. In step 425, if another communication mode is selected, it is initialized. In step 430, the biasing conditions of the analog radio transmitter 150 are monitored by the bias current sensor 185, indicating, for example, how much current the power amplifier 165 is drawing.

In step 435, the temperature of the analog radio transmitter 150, or a selected component therein, is monitored by the temperature sensor 180. In step 440, the initialization flag is read to determine whether the process 400 has completed at least one cycle (i.e., steps 445, 450 and 455 have been implemented). An initialization flag set to one, as implemented in step 405, indicates that the process 400 has not completed at least one cycle. If the initialization flag is determined in step 440 to be one, in step 445 the pre-distortion compensation parameters are set up for the digital pre-distortion compensation module 205 by selecting one of a plurality of look up tables (LUTs) from an LUT memory 190 based on the temperature monitored by temperature sensor 180 and/or the bias current as measured by the bias current sensor 185.

Amplitude or phase changes associated with the power amplifier 165, as monitored by the power detector 175 or any other parameter that the programmer and/or designer of the DBB transmitter 100 desires to have monitored may be used to select an LUT from the LUT memory 190. The LUT memory 190 may reside in the digital pre-distortion compensation module 205, in the controller 155 or in any other desirable location within DBB transmitter 100.

In step 450, carrier leakage, (i.e., direct current (DC) levels), on the I and Q signal components is suppressed by the digital DC offset compensation module 210. In step 455, amplitude and phase imbalances are compensated by using the digital amplitude imbalance compensation module 215 and the digital phase imbalance compensation module 220, respectively, as described above.

After the process 400 completes one cycle, by completing step 455, the initialization flag is set to zero in step 460 and the process returns to step 430 whereby if it is determined in step 465 that there was a significant change in the bias current and/or temperature, the steps 445, 450 and 455 of compensating various parameters of the analog radio transmitter 150 may be repeated.

Upon powering up the DBB transmitter 100, it is envisioned that all of the digital compensation modules in DBB compensation processor 130 would be implemented to optimize the parameters of the analog radio transmitter 150 prior to commencing communications. After the commencement of communications, selective ones of the digital compensation modules 205, 210, 215, 220 may be configured to run on a periodic or continuous basis, or in response to a particular event or user request. For example, if the temperature sensor 180 in the analog radio transmitter 150 detects a certain rise in temperature (e.g., five degrees), the activation of one or more of the digital compensation modules 205, 210, 215, 220 may be desired.

Figure 5:
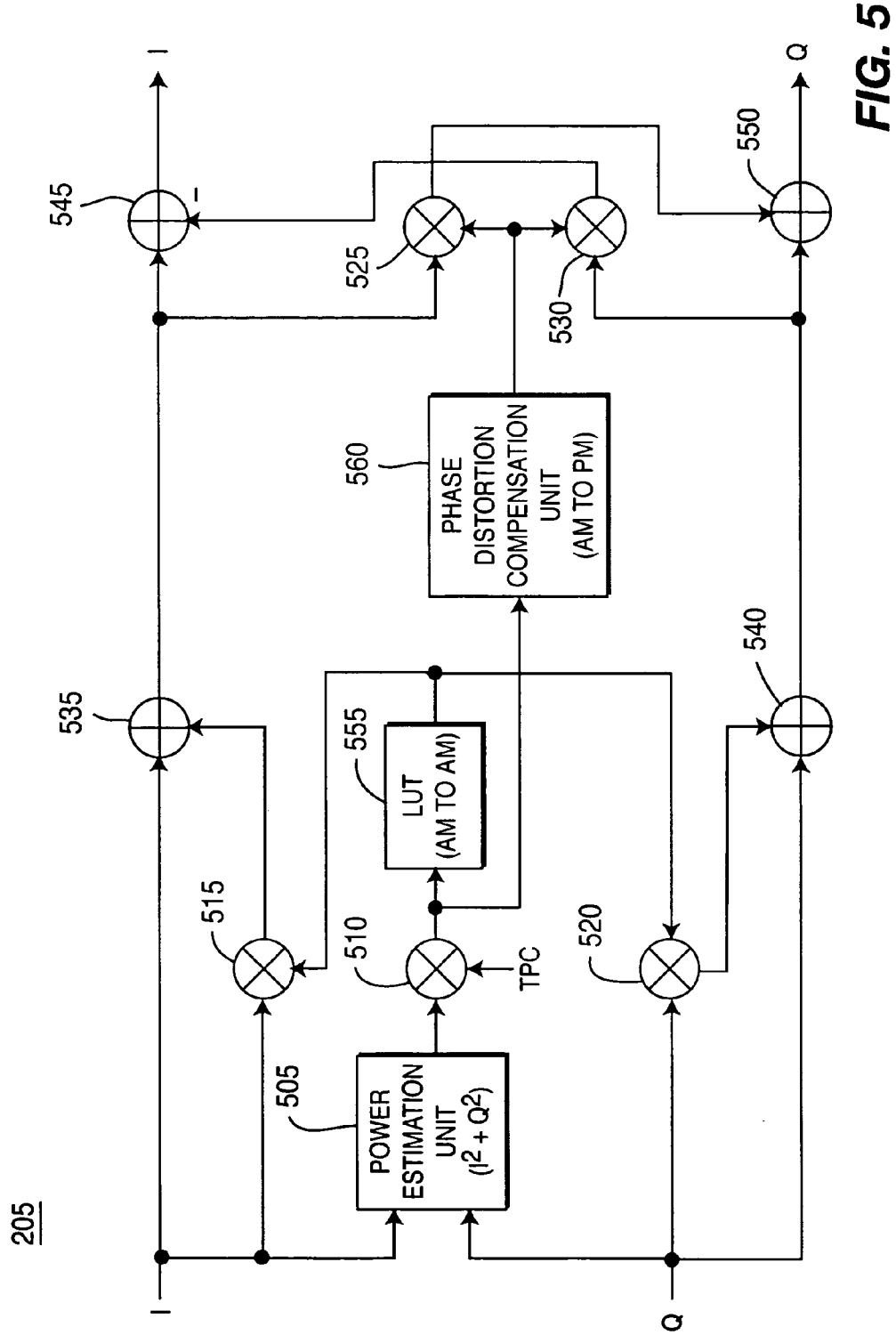
FIG. 5 shows an exemplary configuration of the digital pre-distortion compensation module of FIG. 2.

FIG. 5 shows an exemplary configuration of the digital pre-distortion compensation module 205 including a power estimation unit 505, multipliers 510, 515, 520, 525, 530, adders 535, 540, 545, 550, LUT 555 and phase distortion compensation unit 560. The I and Q signal components are received at power estimation unit 505 which estimates the power using $I^2+Q^2$. The output of the power estimation unit 505 ($I^2+Q^2$) is multiplied by a transmit power control (TPC) via multiplier 510, and the resulting product is input into LUT 555, which provides AM to AM compensation for deficiencies in the analog radio transmitter 150. The TPC controls the output power of the analog radio transmitter 150, as designated by the resulting product $(I^2+Q^2) \times TPC$. The LUT 555 provides the RF characteristic information associated with the power amplifier 165 and/or other components of the analog radio transmitter 150 such that deficiencies of the amplifier 165, such as undesired gain compression and/or dynamic range characteristics which cause nonlinearity of the RF output at antenna 160, may be eliminated. The output of the LUT 555 is multiplied by the I and Q signal components via multipliers 515 and 520, and the resulting products are added to the I and Q signal components via adders 535 and 540, respectively. Thus, the amplitude characteristics of the I and Q signal components are altered in accordance with the LUT 555 so as to compensate for distorted amplitude characteristics of the analog radio transmitter 150.

Referring still to FIG. 5, the product of ($I^2+Q^2$) and the TPC is also input into phase distortion compensation unit 560 which provides AM to PM compensation for deficiencies in the analog radio transmitter 150. The phase distortion compensation unit 560, operating in conjunction with multipliers 525, 530 and adders 545, 550, adjusts the phase differentiation between the I and Q signal components such that they are orthogonal to each other, (i.e., the real and imaginary signal parts have a phase difference of 90 degrees).

Figure 6:
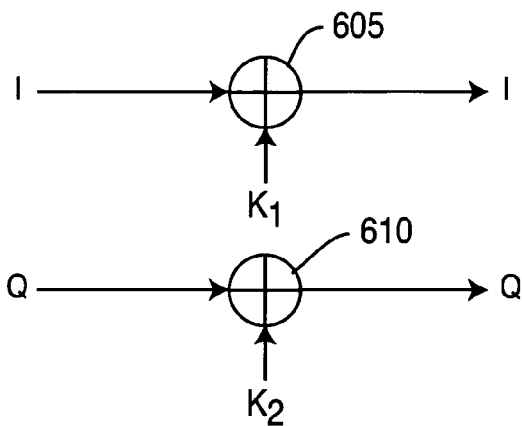
FIG. 6 shows an exemplary configuration of the digital DC offset compensation module of FIG. 2.

FIG. 6 shows an exemplary configuration of the digital DC offset compensation module 210 including adders 605 and 610. Compensation factors $K_1$ and $K_2$ are added to the I and Q signal components, respectively, such that carrier leakage is eliminated by canceling out undesired DC offsets.

Figure 7:
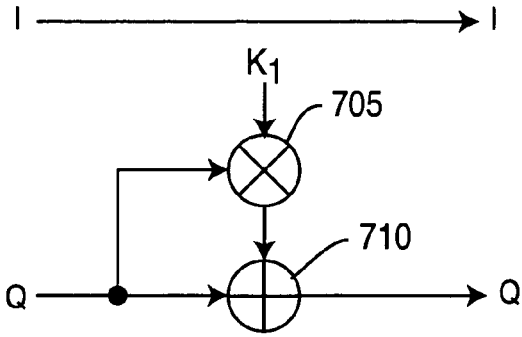
FIG. 7 shows an exemplary configuration of the digital amplitude imbalance compensation module of FIG. 2.

FIG. 7 shows an exemplary configuration of the digital amplitude imbalance compensation module 215 including multiplier 705 and adder 710. Compensation factor $K_1$ is multiplied with the Q signal component via multiplier 705, and the resulting product is then added to the Q component via adder 710, such that the power level of the Q signal component is adjusted to be the same as the I signal component. Note that the sole purpose of the multiplier 705 is to avoid the unintentional deactivation of the Q signal component should the value of $K_1=0$. Alternatively, the configuration of multiplier 705 and adder 710 may be incorporated into the I signal component, or in both of the I and Q signal components.

Figure 8:
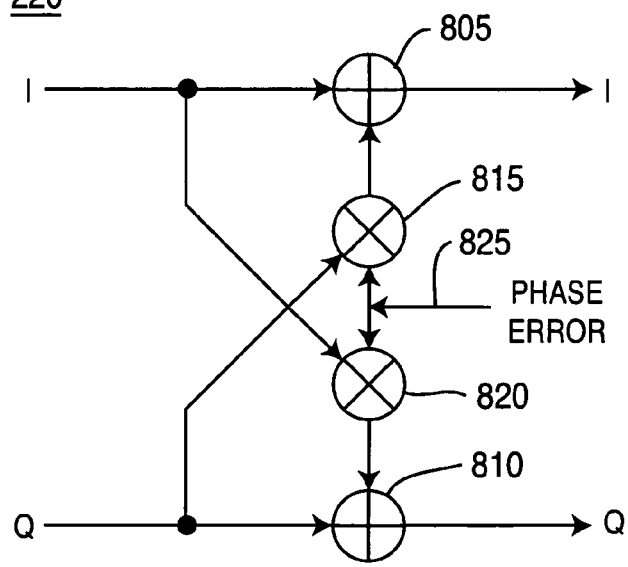
FIG. 8 shows an exemplary configuration of the digital phase imbalance compensation module of FIG. 2.

FIG. 8 shows an exemplary configuration of the digital phase imbalance compensation module 220 including adders 805, 810 and multipliers 815, 820. In response to a phase error 825 which indicates that the I and Q components are not orthogonal to each other, the phase difference between the I and Q components are adjusted accordingly.

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) transmitter comprising:
   (a) an analog radio transmitter including a temperature sensor;
   (b) a plurality of digital compensation modules;
   (c) a memory for storing a plurality of look up tables (LUTs); and
   (d) at least one controller in communication with the analog radio transmitter and each of the digital compensation modules, wherein the digital compensation modules correct radio frequency (RF) parameter deficiencies that occur in the analog radio transmitter, the temperature sensor monitors a temperature reading associated with the analog radio transmitter, and a particular one of the LUTs is selected from the memory to set up parameters for at least one of the digital compensation modules in response to the temperature reading monitored by the temperature sensor, and the digital compensation modules include a digital direct current (DC) offset compensation module having two signal inputs including an in-phase (I) signal component and a quadrature (Q) signal component, the analog radio transmitter includes a modulator prone to a carrier leakage deficiency, a minimum detected power reading associated with each of the signal inputs is determined, first and second DC offset compensation values are determined by interpolating the minimum detected power readings, and the digital DC offset compensation module is configured to eliminate carrier leakage associated with the modulator by adjusting the respective DC levels of the two signal inputs based on the first and second DC offset compensation values.

2. The DBB transmitter of claim 1 wherein the analog radio transmitter further comprises:
   (i) a power amplifier;
   (ii) a modulator; and
   (iii) a power detector.

3. The DBB transmitter of claim 1 wherein the analog radio transmitter further comprises a bias current sensor for monitoring a bias current reading associated with the analog radio transmitter, and at least one of the digital compensation modules is activated in response to the bias current sensor.

4. The DBB transmitter of claim 1 wherein the digital compensation modules include a digital pre-distortion compensation module having two signal inputs including an in-phase (I) signal component and a quadrature (Q) signal component, the power amplifier is prone to a linearity deficiency, and the digital pre-distortion compensation module is configured to distort the phase and amplitude of the I and Q signal components based on gain and phase characteristics of the power amplifier stored in the selected LUT, such that the power amplifier generates a linear response rather than a distorted response.

5. The DBB transmitter of claim 1 wherein the digital compensation modules include a digital pre-distortion compensation module having two signal inputs including an in-phase (I) input and a quadrature (Q) input, the DBB transmitter further comprising:
   (e) a low pass filter (LPF) coupled to each of the I and Q inputs of the digital pre-distortion compensation module; and
   (f) at least one digital to analog converter (DAC) for interfacing the digital compensation modules with the analog radio transmitter.

6. The DBB transmitter of claim 5 wherein each LPF is a root-raised cosine (RRC) filter.

7. The DBB transmitter of claim 1 wherein the modulator has a local oscillator (LO) frequency at which the minimum detected power readings are determined.

8. The DBB transmitter of claim 1 wherein the digital compensation modules include a digital amplitude imbalance compensation module having two signal inputs including an in-phase (I) signal component and a quadrature (Q) signal component, the analog radio transmitter includes a modulator prone to an amplitude balance deficiency, and the digital amplitude imbalance compensation module is configured to adjust the power level of one of the I and Q signal components, such that the power level of each of the I and Q signal components is the same.

9. The DBB transmitter of claim 1 wherein the digital compensation modules include a digital phase imbalance compensation module having two signal inputs including an in-phase (I) signal component and a quadrature (Q) signal component, the analog radio transmitter includes a modulator prone to a phase balance deficiency, and the digital phase imbalance compensation module is configured to adjust the phase of the I and Q signal components, such that the phase of each of the I and Q signal components are orthogonal to each other.

10. The DBB transmitter of claim 1 further comprising:
(e) a modem for generating in-phase (I) and quadrature (Q) signal components which are input to each of the digital compensation modules and the analog radio transmitter.

11. A wireless transmit/receive unit (WTRU) comprising:
(a) an analog radio transmitter including a temperature sensor;
(b) a plurality of digital compensation modules;
(c) a memory for storing a plurality of look up tables (LUTs); and
(d) at least one controller in communication with the analog radio transmitter and each of the digital compensation modules, wherein the digital compensation modules correct radio frequency (RF) parameter deficiencies that occur in the analog radio transmitter, the temperature sensor monitors a temperature reading associated with the analog radio transmitter, and a particular one of the LUTs is selected from the memory to set up parameters for at least one of the digital compensation modules in response to the temperature reading monitored by the temperature sensor, and the digital compensation modules include a digital DC offset compensation module having two signal inputs including an in-phase (I) signal component and a quadrature (Q) signal component, the analog radio transmitter includes a modulator prone to a carrier leakage deficiency, a minimum detected power reading associated with each of the signal inputs is determined, first and second DC offset compensation values are determined by interpolating the minimum detected power readings and the digital DC offset compensation module is configured to eliminate carrier leakage associated with the modulator by adjusting the respective DC levels of the two signal inputs based on the first and second DC offset compensation values.

12. The WTRU of claim 11 wherein the analog radio transmitter further comprises:
(i) a power amplifier;
(ii) a modulator; and
(iii) a power detector.

13. The WTRU of claim 11 wherein the analog radio transmitter further comprises a bias current sensor for monitoring a bias current reading associated with the analog radio transmitter, and at least one of the digital compensation modules is activated in response to the bias current sensor.

14. The WTRU of claim 11 wherein the digital compensation modules include a digital pre-distortion compensation module having two signal inputs including an in-phase (I) signal component and a quadrature (Q) signal component, the power amplifier is prone to a linearity deficiency, and the digital pre-distortion compensation module is configured to distort the phase and amplitude of the I and Q signal components based on the gain and phase characteristics of the power amplifier stored in the selected LUT, such that the power amplifier generates a linear response rather than a distorted response.

15. The WTRU of claim 11 wherein the digital compensation modules include a digital pre-distortion compensation module having two signal inputs including an in-phase (I) input and a quadrature (Q) input, the WTRU further comprising:
(e) a low pass filter (LPF) coupled to each of the I and Q inputs of the digital pre-distortion compensation module; and
(f) at least one digital to analog converter (DAC) for interfacing the digital compensation modules with the analog radio transmitter.

16. The WTRU of claim 15 wherein each LPF is a root-raised cosine (RRC) filter.

17. The WTRU of claim 11 wherein the modulator has a local oscillator (LO) frequency at which the minimum detected power readings are determined.

18. The WTRU of claim 11 wherein the digital compensation modules include a digital amplitude imbalance compensation module having two signal inputs including an in-phase (I) signal component and a quadrature (Q) signal component, the analog radio transmitter includes a modulator prone to an amplitude balance deficiency, and the digital amplitude imbalance compensation module is configured to adjust the power level of one of the I and Q signal components, such that the power level of each of the I and Q signal components is the same.

19. The WTRU of claim 11 wherein the digital compensation modules include a digital phase imbalance compensation module having two signal inputs including an in-phase (I) signal component and a quadrature (Q) signal component, the analog radio transmitter includes a modulator prone to a phase balance deficiency, and the digital phase imbalance compensation module is configured to adjust the phase of the I and Q signal components, such that the phase of each of the I and Q signal components are orthogonal to each other.

20. The WTRU of claim 11 further comprising:
(e) a modem for generating in-phase (I) and quadrature (Q) signal components which are input to each of the digital compensation modules and the analog radio transmitter.

21. An integrated circuit (IC) for processing signals input to an analog radio transmitter including a temperature sensor, the IC comprising:
(a) a plurality of digital compensation modules;
(b) a memory for storing a plurality of look up tables (LUTs); and
(c) at least one controller in communication with the each of the digital compensation modules, wherein the digital compensation modules correct radio frequency (RF) parameter deficiencies that occur in the analog radio transmitter, the temperature sensor monitors a temperature reading associated with the analog radio transmitter, and a particular one of the LUTs is selected from the memory to set up parameters for at least one of the digital compensation modules in response to the temperature reading monitored by the temperature sensor, and the digital compensation modules include a digital direct current (DC) offset compensation module having two signal inputs including an in-phase (I) signal component and a quadrature (Q) signal component, the analog radio transmitter includes a modulator prone to a carrier leakage deficiency, a minimum detected power reading associated with each of the signal inputs is determined, first and second DC offset compensation values are determined by interpolating the minimum detected power readings, and the digital DC offset compensation module is configured to eliminate carrier leakage associated with the modulator by adjusting the respective DC levels of the two signal inputs based on the first and second DC offset compensation values.

22. The IC of claim 21 wherein the digital compensation modules include a digital pre-distortion compensation module having two signal inputs including an in-phase (I) signal component and a quadrature (Q) signal component, and the digital pre-distortion compensation module is configured to distort the phase and amplitude of the I and Q signal components based on information stored in the selected LUT, such that at least one RF characteristic of the analog radio transmitter is improved.

23. The IC of claim 21 wherein the digital compensation modules include a digital pre-distortion compensation module having two signal inputs including an in-phase (I) input and a quadrature (Q) input, the IC further comprising:
(d) a low pass filter (LPF) coupled to each of the I and Q inputs of the digital pre-distortion compensation module; and
(e) at least one digital to analog converter (DAC) for interfacing the digital compensation modules with the analog radio transmitter.

24. The IC of claim 23 wherein each LPF is a root-raised cosine (RRC) filter.

25. The IC of claim 21 wherein the modulator has a local oscillator (LO) frequency at which the minimum detected power readings are determined.

26. The IC of claim 21 wherein the digital compensation modules include a digital amplitude imbalance compensation module having two signal inputs including an in-phase (I) signal component and a quadrature (Q) signal component, the analog radio transmitter includes a modulator prone to an amplitude balance deficiency, and the digital amplitude imbalance compensation module is configured to adjust the power level of one of the I and Q signal components, such that the power level of each of the I and Q signal components is the same.

27. The IC of claim 21 wherein the digital compensation modules include a digital phase imbalance compensation module having two signal inputs including an in-phase (I) signal component and a quadrature (Q) signal component, the analog radio transmitter including a modulator prone to a phase balance deficiency, and the digital phase imbalance compensation module is configured to adjust the phase of the I and Q signal components, such that the phase of each of the I and Q signal components are orthogonal to each other.

28. The IC of claim 21 further comprising:
(d) a modem for generating in-phase (I) and quadrature (Q) signal components which are input to each of the digital compensation modules.

29. A digital baseband (DBB) transmitter comprising:
(a) an analog radio transmitter including a modulator prone to a carrier leakage deficiency; and
(b) a digital direct current (DC) offset compensation module having two signal inputs including an in-phase (I) signal component and a quadrature (Q) signal component, wherein a minimum detected power reading associated with each of the signal inputs is determined, first and second DC offset compensation values are determined by interpolating the minimum detected power readings, and the digital DC offset compensation module is configured to eliminate carrier leakage associated with the modulator by adjusting the respective DC levels of the two signal inputs based on the first and second DC offset compensation values.

30. The DBB transmitter of claim 29 wherein the modulator has a local oscillator (LO) frequency at which the minimum detected power readings are determined.

31. A wireless transmit/receive unit (WTRU) comprising:
(a) an analog radio transmitter including a modulator prone to a carrier leakage deficiency; and
(b) a digital direct current (DC) offset compensation module having two signal inputs including an in-phase (I) signal component and a quadrature (Q) signal component, wherein a minimum detected power reading associated with each of the signal inputs is determined, first and second DC offset compensation values are determined by interpolating the minimum detected power readings, and the digital DC offset compensation module is configured to eliminate carrier leakage associated with the modulator by adjusting the respective DC levels of the two signal inputs based on the first and second DC offset compensation values.

32. The WTRU of claim 31 wherein the modulator has a local oscillator (LO) frequency at which the minimum detected power readings are determined.

33. An integrated circuit (IC) for processing signals input to an analog radio transmitter including a modulator prone to a carrier leakage deficiency, the IC comprising:
(a) a digital direct current (DC) offset compensation module having two signal inputs including an in-phase (I) signal component and a quadrature (Q) signal component, wherein a minimum detected power reading associated with each of the signal inputs is determined, first and second DC offset compensation values are determined by interpolating the minimum detected power readings, and the digital DC offset compensation module is configured to eliminate carrier leakage associated with the modulator by adjusting the respective DC levels of the two signal inputs based on the first and second DC offset compensation values; and
(b) at least one digital to analog converter (DAC) for interfacing the digital DC offset compensation module with the analog radio transmitter.

34. The IC of claim 33 wherein the modulator has a local oscillator (LO) frequency at which the minimum detected power readings are determined.

* * * * *

UNITED STATES PATENT AND TRADEMARK OFFICE
CERTIFICATE OF CORRECTION

| | | |
|---|---|---|
| PATENT NO. | : 7,133,644 B2 | Page 1 of 1 |
| APPLICATION NO. | : 10/736294 | |
| DATED | : November 7, 2006 | |
| INVENTOR(S) | : Demir et al. | |

It is certified that error appears in the above-identified patent and that said Letters Patent is hereby corrected as shown below:

IN THE SPECIFICATION

Column 6, line 6, before the words "or the like", delete "200" and insert therefor --2000--.

IN THE CLAIMS

Claim 21, column 10, line 56, after the word "with", delete "the".

Signed and Sealed this

Nineteenth Day of June, 2007

JON W. DUDAS
*Director of the United States Patent and Trademark Office*